United States Patent [19]

Hideshima et al.

[11] Patent Number: 5,124,772

[45] Date of Patent: Jun. 23, 1992

[54] INSULATED GATE BIPOLAR TRANSISTOR WITH A SHORTENED CARRIER LIFETIME REGION

[75] Inventors: Makoto Hideshima, Tokyo; Tetsujiro Tsunoda, Fujisawa; Masashi Kuwahara; Shingo Yanagida, both of Yokohama, all of Japan

[73] Assignee: Kabushiki Kaisha Toshiba, Kawasaki, Japan

[21] Appl. No.: 579,660

[22] Filed: Sep. 10, 1990

[30] Foreign Application Priority Data

Sep. 11, 1989 [JP] Japan .................. 1-234955

[51] Int. Cl.⁵ .............. H01L 29/00; H01L 29/74; H01L 29/747; H01L 29/10
[52] U.S. Cl. .................... 357/37; 357/38; 357/39; 357/23.4; 357/23.3; 357/23.1; 437/247; 437/173
[58] Field of Search ........... 357/37, 38, 39, 23.1, 357/23.3, 23.4; 437/247, 173

[56] References Cited

U.S. PATENT DOCUMENTS

| 4,925,812 | 5/1990 | Gould | 357/23.4 |
| 5,017,508 | 5/1991 | Dodt et al. | 437/173 |

FOREIGN PATENT DOCUMENTS

| 82/02981 | 9/1982 | European Pat. Off. |  |
| 2088631 | 9/1982 | European Pat. Off. |  |
| 8202981 | 9/1982 | European Pat. Off. | 357/23.4 |
| 3823270 | 3/1989 | European Pat. Off. | 357/23.4 |
| 57-120369 | 7/1982 | Japan |  |
| 0068979 | 4/1983 | Japan | 357/23.4 |
| 59-149058 | 8/1984 | Japan |  |
| 0064165 | 4/1986 | Japan | 357/23.4 |
| 63-127571 | 5/1988 | Japan |  |

OTHER PUBLICATIONS

Sakurai et al., "600 V and 1200 V MOS-Gate Bipolar Transistor (MBT) Module for High Frequency PWM Inverter", PCIM 88 Proceeding.

Baliga, "Switching Speed Enhancement in Insulated Gate Transistors by Electron Irradiation, Jayant Baliga," IEEE Transactions on Electron Devices, vol. Ed-31, No. 12, pp. 1790-1796, Dec. 1984.

Goodman et al., "Improved COMFETs with Fast Switching Speed and High-Current Capability," International Electron Devices Meeting, IEEE, 1983.

*Primary Examiner*—Rolf Hille
*Assistant Examiner*—Wael Fahmy
*Attorney, Agent, or Firm*—Finnegan, Henderson, Farabow, Garrett and Dunner

[57] ABSTRACT

In a power semiconductor device such as an IGBT, a fifth region of n conductivity type is provided. The fifth region is formed in a portion of a second region (drain region) contacting an insulating layer below the gate layer. The fifth region contacts a third region (base region) and has an impurity concentration higher than that of the second region. Therefore, even when a carrier life time is sufficiently short, an electron distribution density can be kept high in the entire fifth region and the second region under the third region (base region) near the fifth region, and the localization of a hole current is moderated (in a case of a p-type base and an n-type drain). As a result, a maximum controllable current is increased, and a wide safe operation area can be obtained.

8 Claims, 9 Drawing Sheets

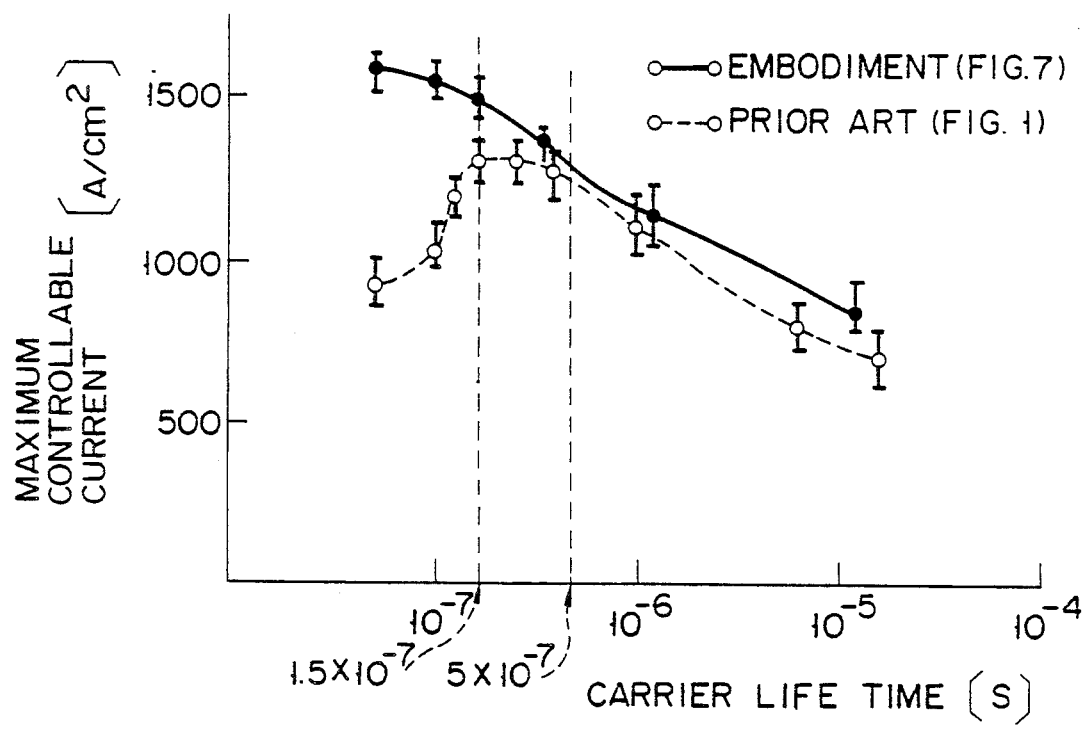
F I G. 9
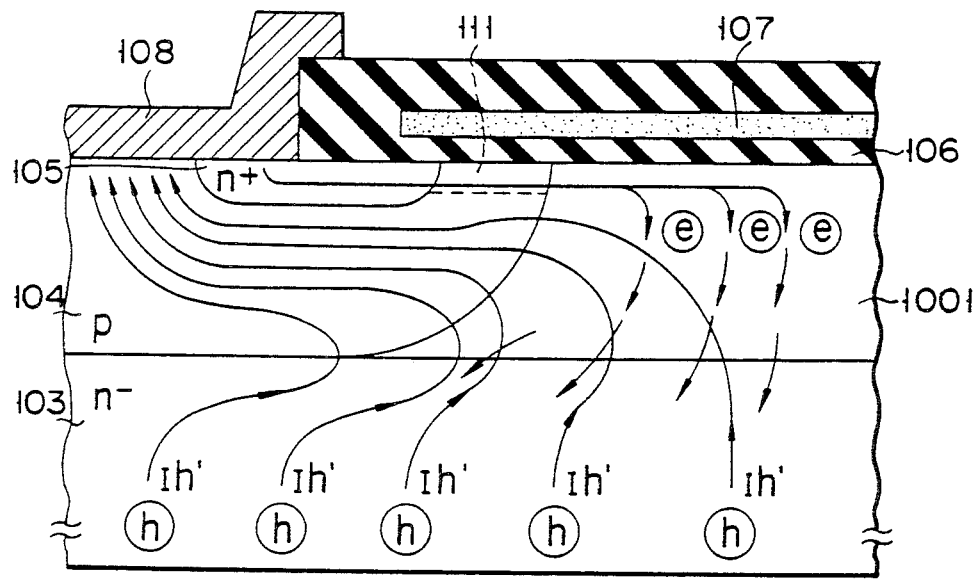
F I G. 10

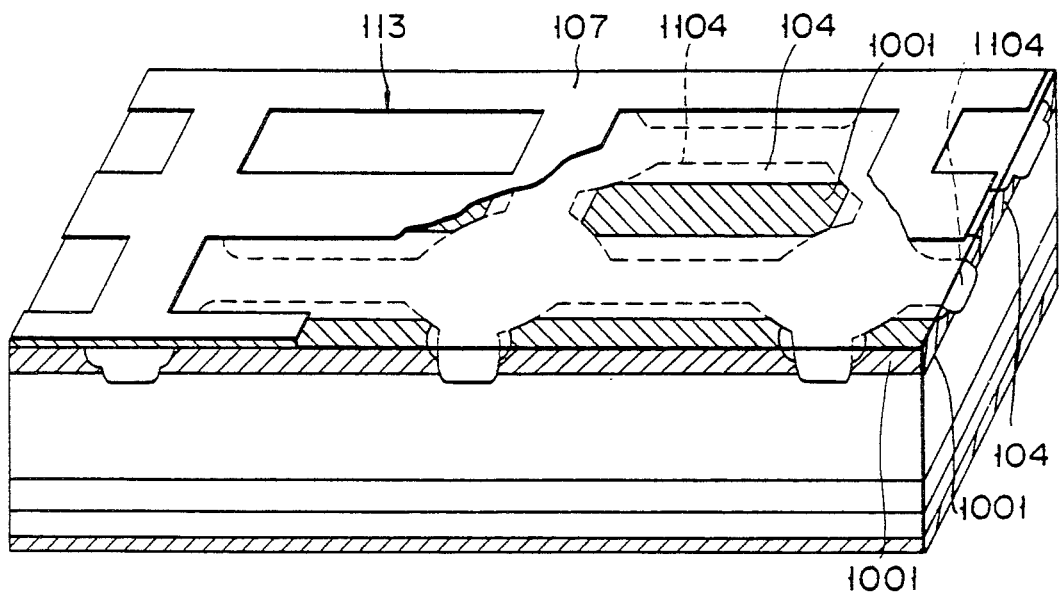
F I G. 13
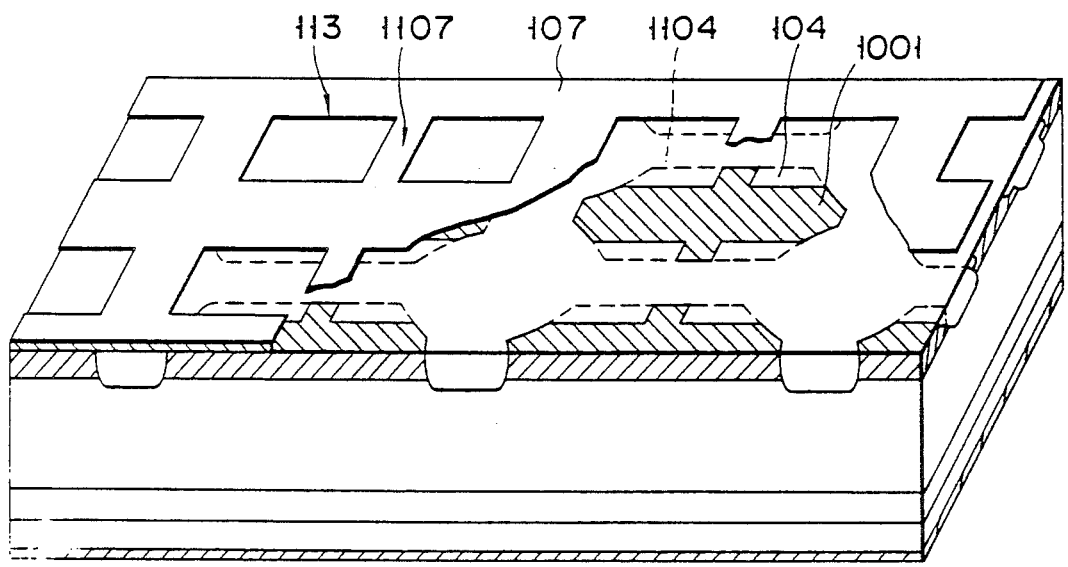
F I G. 14

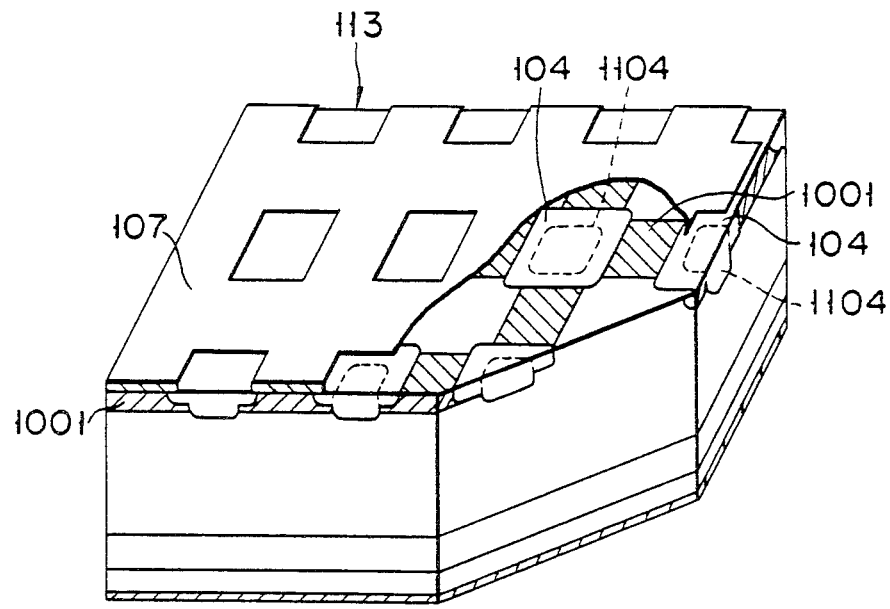
F I G. 15
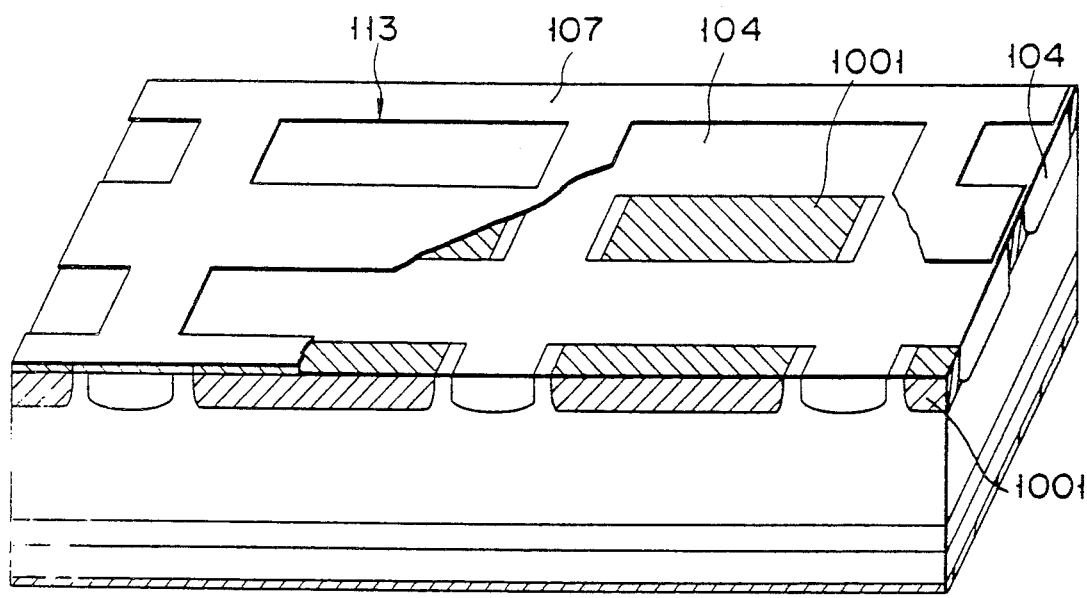
F I G. 16

INSULATED GATE BIPOLAR TRANSISTOR WITH A SHORTENED CARRIER LIFETIME REGION

BACKGROUND OF THE INVENTION

1. Field of the Invention

The present invention relates to a power semiconductor device and, more particularly, to a structure of IGBT (Insulated Gate Bipolar Transistor).

2. Description of the Related Art

An IGBT is a transistor having a sectional structure represented by FIG. 1 and has a composite structure having a MOSFET (metal oxide semiconductor field effect transistor) structure section at an upper portion and a bipolar transistor structure section at a lower portion. The structure and operation of the transistor are disclosed in the specification and drawings of Published Examined Japanese Patent Application No. 57-120369. FIG. 1 especially shows an n-channel IGBT. In the IGBT shown in FIG. 1, an n+-type buffer region 102 and an n−-type drain region 103 are sequentially formed on one major surface of a p-type substrate (anode) 101, a p-type base region 104 is formed in the n−-type drain region 103 by an impurity diffusion method, and an n+-type source region 105 is formed in the p-type base region 104 by an impurity diffusion method. A thin oxide film 106 (dielectric layer) is formed on the semiconductor body, and a polysilicon gate electrode 107 is formed on the oxide film 106. A metal source electrode 108 is formed on the semiconductor body such that the p-type base region 104 and the n+-type source region 105 are short-circuited. A metal gate electrode 109 and a metal anode electrode 110 are formed on the polysilicon gate electrode 107 and the other major surface of the p+-type substrate (anode) 101, respectively.

The source electrode 108 is grounded, and a positive voltage is applied to the anode electrode 110. In this state, when the gate electrode 109 is kept at a negative potential, the semiconductor device is in an OFF state. When a positive voltage is applied to the gate electrode 109, an inverted channel 111 is formed on the surface region of the p-type base region 104, as in a conventional MOSFET. In addition, some of electrons flow in to a surface portion 112 of the n−-type drain region 103 from the n+-type source region 105 through the channel 111 to form an electron storing layer. Other electrons are moved in the n−-type drain region 103 toward the anode electrode 110 side by a voltage applied between the source and anode, and a junction between the p+-type anode region (substrate) 101 and the n+-type buffer region 102 is forward-biased. Thus, holes are injected from the p+-type anode region 101 into the n−-type drain region 103 through the n+-type buffer region 102, and the conductivity in the n−-type drain region 103 is modulated to cause the semiconductor device to be in an ON state. In this state, when the gate electrode 109 is returned to zero or a negative potential, the channel 111 is closed, and the semiconductor device is returned to an OFF state.

The most serious drawback of the above structure is that a parasitic thyristor is formed. That is, the parasitic thyristor is constituted by a parasitic npn transistor constituted by the n+-type source 105, the p-type base 104, and the n−-type drain 103, and a parasitic pnp transistor constituted by the p+-type anode 101, the n−-type drain 103, and the p-type base 104. When this parasitic thyristor is turned on, although the channel 111 is closed, an electron flow from the n+-type source 105 to the n−-type drain 103 is maintained by the parasitic npn transistor. For this reason, the device cannot be returned to an OFF state to cause the device to be broken down.

Therefore, in the IGBT device, it is technically important to suppress the turn-ON of the parasitic thyristor, to increase a maximum controllable current as a transistor, and to widen a safe operation area.

These points are disclosed in Published Unexamined Japanese Patent Application No. 57-120369, and a conventional method of controlling the turn-ON of the parasitic thyristor teaches the following:

(1) any means is provided to make it difficult to turn on the parasitic npn transistor; and (2) gains $a_{npn}$ and $a_{pnp}$ of the parasitic npn and pnp transistors are decreased to make it difficult to establish $a_{npn} + a_{pnp} \geq 1$.

As the second drawback of the IGBT, it is known that a turn-OFF time is long. This is because minority carriers injected from the p+-type anode 101 to the n−-type drain 103 are stored in the n−-type drain 103 as excess carriers. Although the channel 111 is closed to stop an electron flow, the device is not returned to an OFF state until the stored minority carriers are swept. As a technique for solving the above problem, it is known that the life time of the carriers is shortened, thereby increasing a recombination speed of the stored carriers, and that the turn-OFF time is shortened. In order to practically shorten the life time of the carriers, the following methods are used:

(1) an impurity having a deep level such as gold or platinum is diffused in the substrate; and (2) high-energy particles such as electrons or neutrons are radiated on the substrate to form a recombination center in a silicon bulk.

By forming this recombination center, the turn-OFF time is shortened, and the gains $a_{npn}$ and $a_{pnp}$ are decreased. Therefore, the turn-ON of the parasitic thyristor is suppressed in comparison with a case where the recombination center is not formed.

When gold is diffused in the substrate, it is known that the gold functions as an accepter, and that the resistivity of the n−-type drain region is increased by a concentration compensation effect. When the life time of the IGBT is practically controlled by a gold diffusion method to obtain a turn-OFF time of 1 μs or less, the concentration compensation effect occurs throughout the entire range of the n−-type drain region 103, and the resistivity is increased throughout the entire range. In order to decrease the resistivity of the region 112, it is proposed that an n-type impurity concentration of the region 112 is increased (PCIM'88 proceedings pp. 134).

The concentration compensation effect caused by a gold diffusion method is conspicuous near the silicon surface. For this reason, a satisfactory electron storing layer is not formed in the region 112 immediately below the oxide film (dielectric layer), and the current conductivity is decreased.

In order to form a satisfactory electron storing layer, the structure shown in FIG. 2 is proposed in the above Published Unexamined Japanese Patent Application No. 57-120369. In this structure, an n+-type region 201 having an impurity concentration of $10^{18}$ to $10^{20}$ atm/cc as an electron storing layer is formed.

When the life time is controlled by diffusing platinum, though it is a heavy metal, the above concentration compensation effect is extremely small. In addition, when the life time is controlled by irradiation of an electron beam, a neutron beam, or the like, the above effect is also extremely small. Therefore, in either case, the decrease in current conductivity due to degradation of an electron storing effect hardly occurs.

Conventionally, an IGBT having a turn-OFF fall time of about 0.3 μs is obtained by life time control using a heavy metal diffusion method with gold, platinum, or the like. However, in the heavy metal diffusion method, diffusion controllability is poor. In practical manufacture, the device is manufactured such that the turn-OFF fall time tf has a width of 0.3 μs to 0.8 μs, and variations in turn-OFF fall time are large. In order to obtain IGBT characteristics of the turn-OFF fall time tf of 0.3 μs or less, a large amount of heavy metal must be diffused. However, when the heavy metal diffusion is performed on this order, not only is the leak current increased in the bulk silicon, but the surface leak current due to segregation in an interface between a silicon surface and a thermal oxide film is also increased. Therefore, the device cannot be used in practice.

According to the development of a life time control technique by an electron beam irradiation or a neutron beam irradiation, the variation in turn-OFF fall time tf is within 0.1 μs, and the turn-OFF fall time tf is 0.3 μs or slightly less than 0.3 μs. According to the further development of the life time control technique by this type of irradiation, the turn-OFF fall time of 0.15 μs or slightly less than 0.15 μs can be obtained. As a result, an IGBT serves as a high-speed turn-OFF device similar to a conventional MOSFET.

According to the development of the life time control method, since a short life-time can be achieved, the gain $\alpha_{pnp}$ can be decreased. According to this, a maximum controllable current can be increased.

However, when the life time control is performed such that the turn-OFF fall time tf is 0.3 μs or less, the maximum controllable current is saturated. When the life time control is performed such that the turn-OFF fall time tf is 0.2 μs or less, the maximum controllable current is decreased. This operation is shown in FIG. 3. Reasons for this can be considered as follows.

That is, in a region in which a life time is relatively long, since the gains $\alpha_{npn}$ and $\alpha_{pnp}$ are large, a total gain $\alpha_{npn} + \alpha_{pnp}$ easily exceeds "1", thereby limiting the maximum controllable current. In order to increase the maximum controllable current, therefore, the life time of carriers must be shortened to decrease the total gain $\alpha_{pnp} + \alpha_{npn}$. However, when the carrier life time is significantly shortened, the parasitic npn transistor is turned on with a smaller current, and the effect of the degradation of the gain $\alpha_{pnp}$ cannot be contributed.

In other words, in a region where the carrier life time is sufficiently short, i.e., the life time is 0.5 μs and the turn-OFF fall time tf is about 1 μs or less, it can be considered that the maximum controllable current of the device is determined by a current density obtained when the parasitic npn transistor is turned on.

In the parasitic npn transistor, the n+-type source 105 serving as an emitter and the p-type base 104 serving as a base are shunt-short circuited by the source electrode 108. However, as shown in FIG. 4, holes "h" injected from the p+-type anode region 101 (in FIG. 1) flow as a hole current into p-type base region 104 while attracted by electrons "e" and are collected to the source electrode 108 through the portion below the n+-type source region 105. By a part Ih' of this hole current and a resistance R of the p-type base region 104 below the n+-type source region 105, a voltage drop of Ih'×R occurs. As a result, a p-n junction between the n+-type source region 105 and the p-type base region 104 is forward-biased. When this forward bias exceeds a built-in voltage of the p-n junction, the electrons "e" are injected from the n+-type source region 105 to the p-type base region 104 to turn on the parasitic npn transistor.

An influence of shortening the carrier life time on a turn-ON mechanism of the parasitic npn transistor will be described below.

FIGS. 5 and 6 schematically show a flow of the hole current Ih' on the basis of analysis result obtained by calculation. FIG. 5 shows a case wherein a life time is relatively long (to $5 \times 10^{-7}$ s), and FIG. 6 shows a case wherein a life time is short (to $5 \times 10^{-8}$ s).

In a conventional IGBT structure, when a carrier life time is long, electrons "e" which flow in the n⁻-type drain region 103 through the channel 111 are diffused below the p-type base region 104. For this reason, the holes h injected from the p+-type anode region 101 almost uniformly flow in the n⁻-type drain region 103 and flow in the p-type base region 104 therefrom.

However, the distribution of the electrons "e" is localized near the electron storing layer 112 by shortening of the carrier life time, and, as shown in FIG. 6, the holes h are attracted in a direction of the electron storing layer 112. As a result, the holes h flow in the p-type base region 104 from only near the electron storing layer 112, i.e., only the side surface of the p-type base region 104 and are localized. Therefore, when the carrier life time is sufficiently short, the hole current Ih' concerning the voltage drop is increased. In other words, in FIG. 5, since R1 to R3 are relatively small, the voltage drop is calculated by the following equation:

$$R4 \times Ih4' + R5 \times Ih5' \simeq R5 \times (2/5)Ih$$

In FIG. 6, the voltage drop is increased to the value calculated by the following equation:

$$R5 \times Ih' = R5 \times Ih$$

Therefore, a forward bias between the emitter (N+-type base region 105) of the parasitic npn transistor and the base (p-type base region 104) is deepened, and the parasitic npn transistor is easily turned on.

SUMMARY OF THE INVENTION

The present invention has been made in view of the above considerations, and has as its object to provide a power semiconductor device and, more particularly, an IGBT wherein, when the carrier life time is sufficiently shortened ($\tau p < 1.5 \times 10^{-7}$ s) to realize high-speed turn-OFF characteristics (tf<0.3 μs), a parasitic npn transistor is not easily turned on to obtain a sufficiently large controllable current, and good high-speed turn-OFF characteristics and a sufficiently wide safe operation area can be obtained.

According to the present invention, there is provided a power semiconductor device comprising a first region constituted by a semiconductor layer of a first conductivity type; a second region constituted by at least one semiconductor layer of a second conductivity type, formed on said first region, and having an exposed surface; a third region constituted by a semiconductor layer of the first conductivity type which is formed in said second region and a surface of which is exposed to said exposed surface of said second region; a fourth region constituted by a semiconductor layer of the second conductivity type which is formed in said third region and a surface of which is exposed to said exposed surface of said third region; an insulating layer formed on said exposed surfaces of said second, third, and fourth regions; and a gate layer formed on said insulating layer; wherein a carrier life time of the second region is set to be shorter than $5 \times 10^{-7}$ s by irradiation of a radioactive beam; and said semiconductor device comprises a fifth region formed near said exposed surface on said second region and having an impurity concentration higher than that of said second region.

According to the above power semiconductor device, a fifth region of a second conductivity type is provided. The fifth region is formed in a portion of a second region (drain region) contacting an insulating layer below the gate layer. The fifth region contacts a third region (base region) and has an impurity concentration higher than that of the second region. Therefore, even when a carrier life time is sufficiently short, an electron distribution density can be kept high in the entire fifth region and the second region under the third region (base region) near the fifth region, and the localization of a hole current is moderated (in a case of a p-type base and an n-type drain). As a result, a maximum controllable current is increased, and a wide safe operation area can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 9 is a view showing relationships between a maximum controllable current and a carrier life time of the conventional device in FIG. 1 and between a maximum controllable current and a carrier life time of the device according to the embodiment in FIG. 7;

FIG. 10 is a view showing a part of the device according to the embodiment in FIG. 7 and showing a flow of a hole current;

FIGS. 12 to 16 are perspective views showing applications and modifications of the embodiment of the present invention in FIG. 7 concerning a planar geometric shape.

DETAILED DESCRIPTION OF THE PREFERRED EMBODIMENTS

Embodiments of the present invention will be described below with reference to the accompanying drawings.

Figure 1:
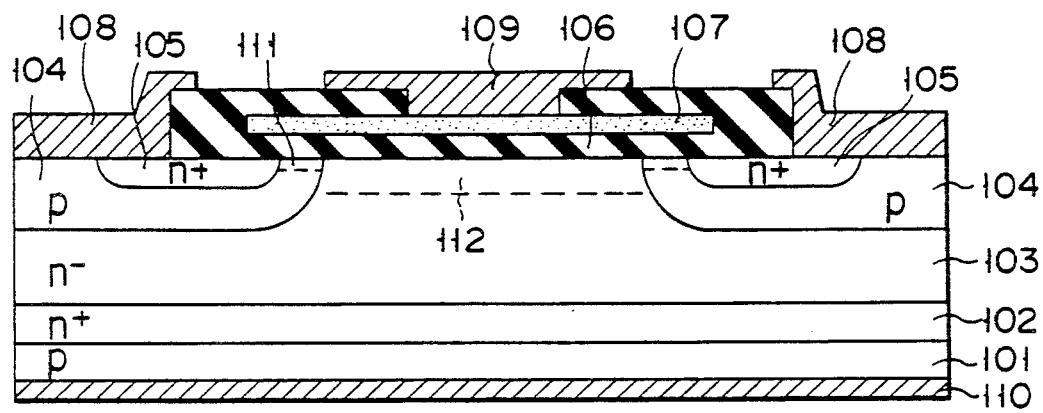
FIGS. 1 and 2 are sectional views showing conventional power semiconductor devices (IGBTs) respectively.
Figure 2:
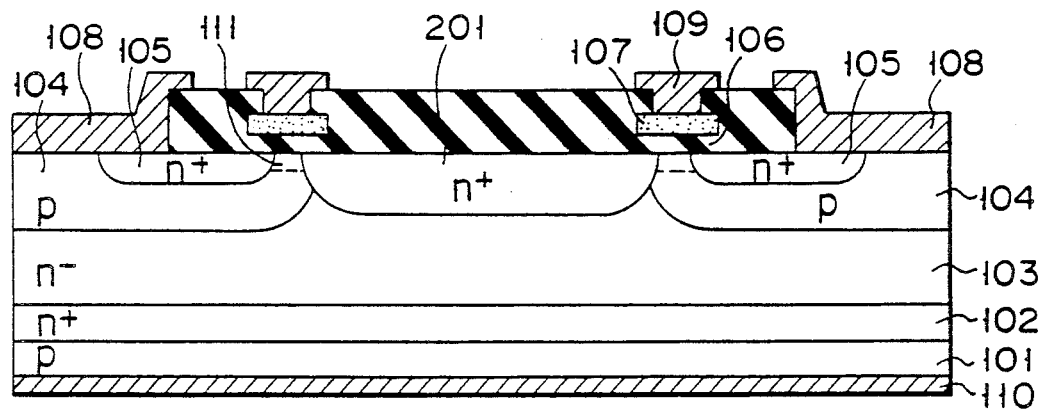
Figure 3:
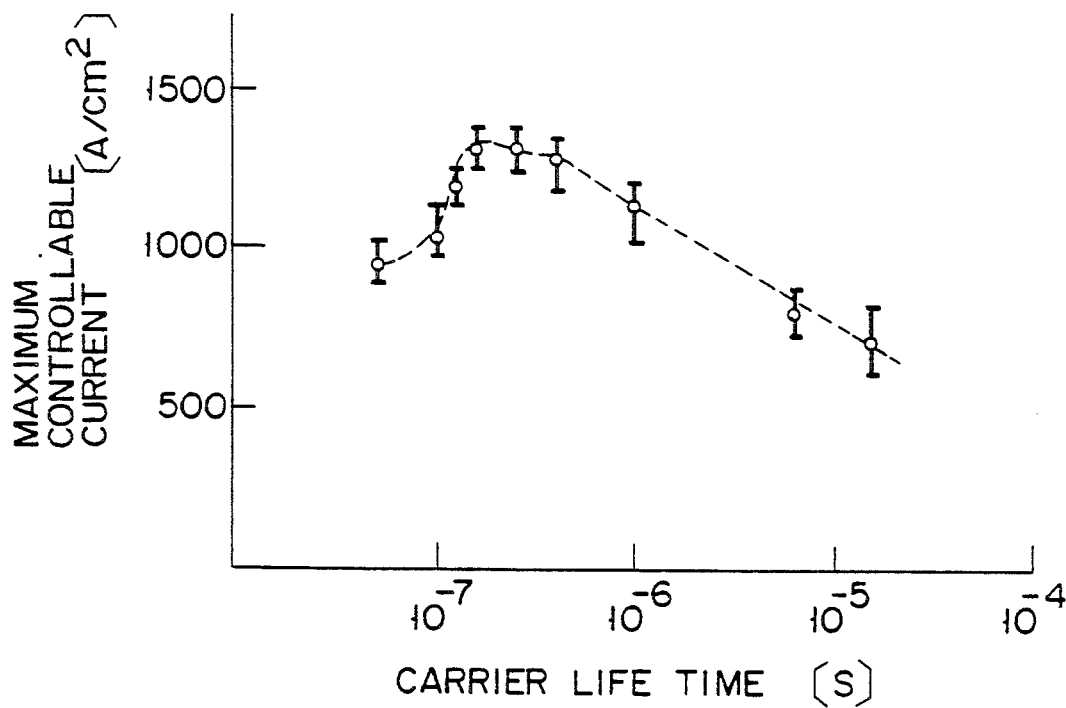
FIG. 3 is a view showing a relationship between a maximum controllable current of the conventional device and a carrier life time.
Figure 4:
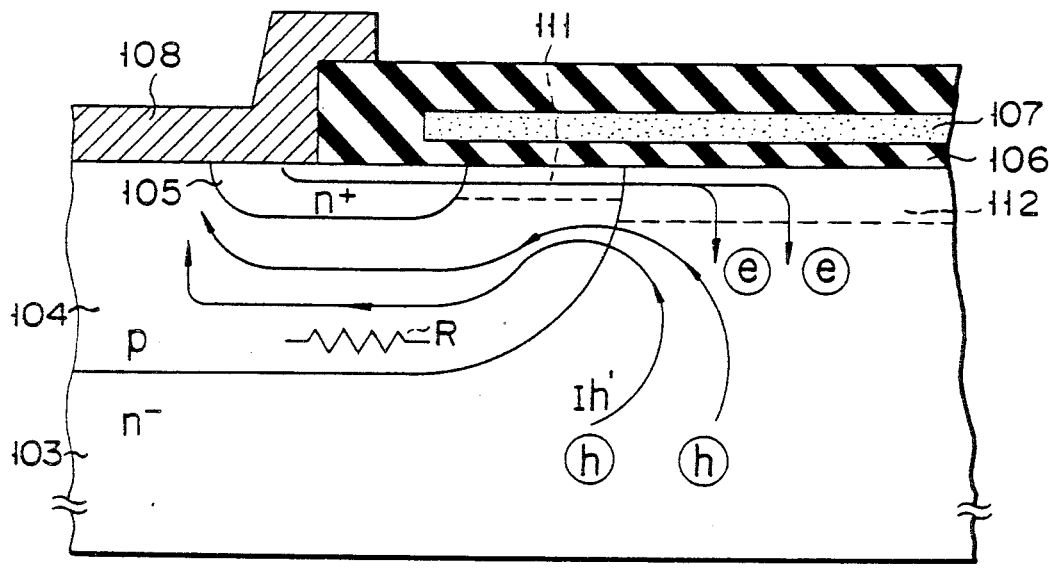
FIGS. 4 to 6 are views showing a part of the conventional device in FIG. 1, and showing a flow of a hole current.
Figure 5:
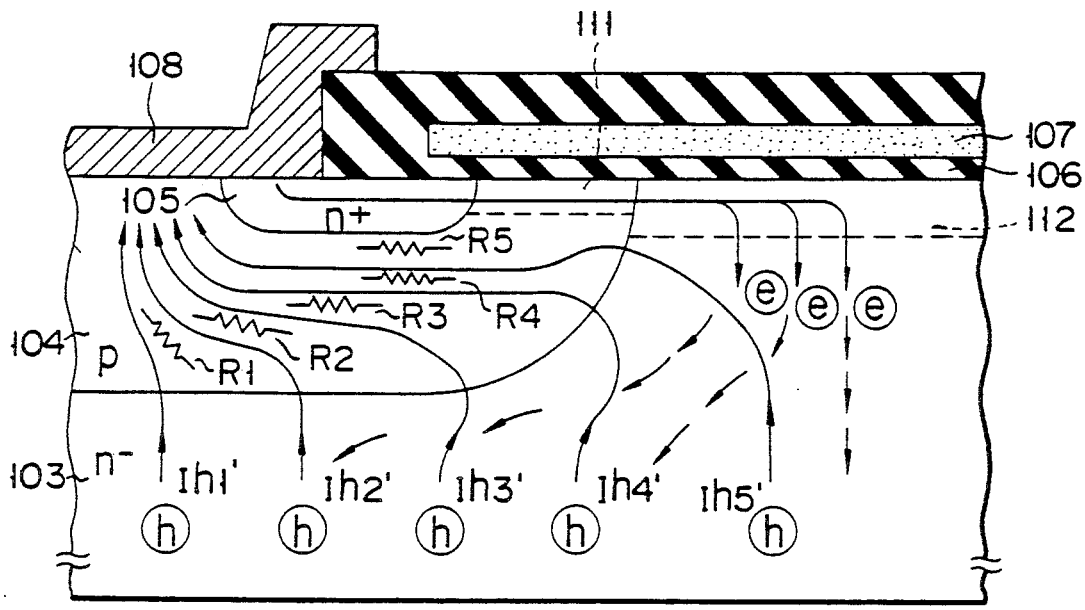
Figure 7:
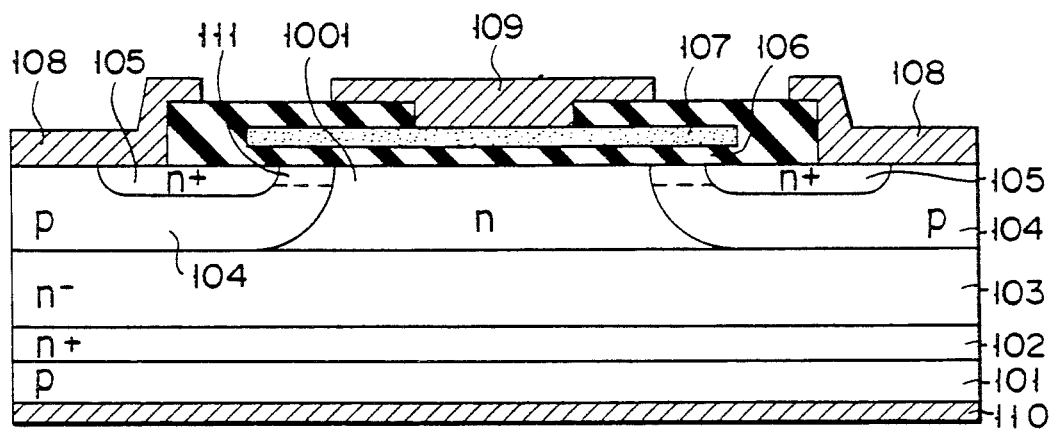
FIG. 7 is a sectional view showing a power semiconductor device (IGBT) according to the first embodiment of the present invention.

FIG. 7 is a sectional view showing a power semiconductor device according to the first embodiment of the present invention. The same reference numerals in FIG. 7 denote the same parts as in FIG. 1.

As a characteristic feature of the structure of the present invention, an n-type impurity concentration of a region 1001 located between p-type base regions 104 in an n⁻-type drain region 103 is increased. A typical impurity concentration of the n-type region 1001 is $10^{14}$ to $10^{17}$ atm/cc, and the n-type region 1001 is formed to have a uniform impurity concentration distribution in a planar direction. The n-type region 1001 is formed to have a depth from the major surface almost equal to the depth of the p-type base region 104 from the major surface.

A manufacturing process of a semiconductor device according to this embodiment will be described below.

As in a conventional device, an n⁺-type high-concentration buffer region 102 is epitaxially grown on a p-type silicon substrate (anode) 101 (typical impurity concentration of $10^{18}$ to $10^{20}$ atm/cc) to have a typical impurity concentration of $10^{16}$ to $10^{17}$ atm/cc and a thickness of about 10 to 20 μm, and an n⁻-type drain region 103 is epitaxially grown on the buffer region 102 to have a typical impurity concentration of $10^{13}$ to $10^{15}$ atm/cc and a thickness of about 30 to 100 μm. At this time, the n⁺-type high-concentration buffer region 102 need not be formed and can be omitted depending on a design concept. The impurity concentration and thickness of each region are variably selected in accordance with a desired breakdown voltage. In this embodiment, the impurity concentration and thickness of the n⁺-type buffer region 102 are respectively set to be $10^{17}$ atm/cc and 15 μm, and the the impurity concentration and thickness of the n⁻-type drain region 103 are respectively set to be $2 \times 10^{14}$ atm/cc and 50 μm. The surface of the drain region 103 of the silicon wafer is oxidized to form an oxide film, and the oxide film is selectively etched using a conventional photoetching method to form an opening leading to an active element forming region of the silicon wafer. An n-type impurity is selectively doped into the silicon wafer through the opening. In this embodiment, phosphorus ions serving as an impurity are implanted in the resultant structure by an ion implantation technique at a dose of $1 \times 10^{12}$ ions/cm². Thereafter, an oxide film is formed over the structure, and the phosphorus ions are diffused in the silicon wafer at a temperature of 1,100° C. for several hours to form an n-type region 1001 in the drain region 103. The subsequent steps are substantially the same as the steps of manufacturing the conventional IGBT in FIG. 1. A p-type region is selectively formed in a guard ring region (not shown in FIG. 7). Thereafter, the oxide film on the silicon wafer is removed, and a thin (e.g., about 1,000 Å) oxide film is formed over the silicon wafer, and a polysilicon layer is epitaxially grown over the thin oxide film to have a thickness of about 5,000 Å. The polysilicon layer is patterned to form an internal gate electrode 107. Thereafter, using the gate electrode 107 as a mask, a p-type impurity is selectively doped into the region 103 to form the p-type base region 104. Thereafter, using the gate electrode 107 as a mask the thin oxide film is patterned to form a gate oxide film 106 on the active element forming region, and an opening leading to a source forming region. An n-type impurity is doped into the source forming region so that an $n^+$-type source region 105 is formed. A metal layer made of, for example, aluminum is formed over the surface of the resultant structure and patterned to form a source electrode 108 and a gate electrode 109 on the corresponding regions. Thereafter, an anode electrode 110 is formed on the anode layer 101. An electron beam (2 to 10 Mrd) is radiated on the resultant structure to complete a semiconductor device.

In this embodiment, a depth xjp of the p-type base region 104 was set at 4 μm, and four types of n-type regions 1001 which respectively had depths of 1 μm 0.25 xjp), 2 μm (0.5 xjp), 3.2 μm (0.8 xjp), and 4.4 μm (1.1 xjp) were formed as samples. These diffusion depths of the n-type regions 1001 are calculated assuming that a time of impurity diffusion for forming the n-type region 1001 and performed prior to implantation of an impurity for forming the p-type base region 104 corresponds to the diffusion depth. When the depth xjp of the n-type region 1001 is set at 4.4 μm, concentration distributions of the n-type region 1001 in the direction of depth are $2 \times 10^{13}$ atm/cc on the surface, $4.1 \times 10^{15}$ atm/cc a depth of 0.5 μm, $3.8 \times 10^{15}$ atm/cc at a depth of 1 μm, $2.3 \times 10^{15}$ atm/cc at a depth of 2 μm, $9.2 \times 10^{14}$ at at a depth of 3 μm, $3.0 \times 10^{14}$ atm/cc at a depth of 4 μm, and $2 \times 10^{14}$ m/cc which is equal to the concentration of a bulk ($n^-$-type drain region 103) at a depth of 4.4 μm. At this time, as an impurity implanted in the $n^+$-type source region 105, arsenic was used, and a diffusion depth was set to be about 0.2 μm. That is, the n-type region 1001 is deeper than the $n^+$-type source region 105 and has a peak concentration at a depth of ⅛ of the depth xjp of the p-type base region 104, and a profile having a concentration higher than the impurity concentration of the n-type chain region 103 by about 10 times at a depth corresponding to ⅛ to 6/8 of the depth xjp is formed.

Figure 8:
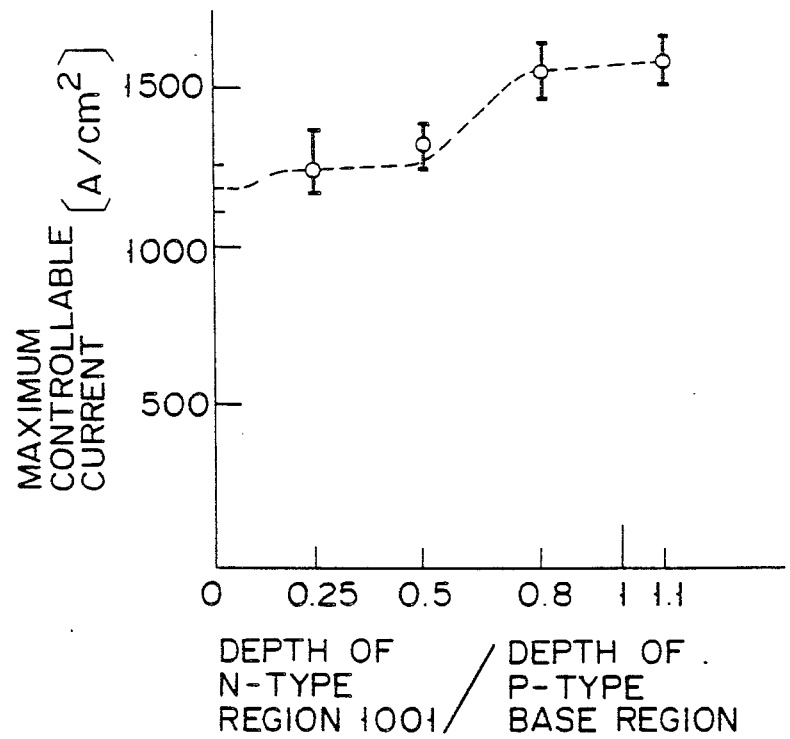
FIG. 8 is a view showing a relationship between a maximum controllable current of the device according to the embodiment in FIG. 7 and [n-type region depth/p-type base region depth]

An electron beam of 6 Mrd was radiated on semiconductor device samples on which the above four types of n-type regions 1001 having different diffusion depths were formed, a carrier life time was controlled to about 50 ns, and maximum controllable currents of the semiconductor devices were measured. FIG. 8 shows the resultant values. A point "0" along the abscissa [n-type region depth/p-type base region depth] in FIG. 8 represents the maximum controllable current of an IGBT having the conventional structure (FIG. 1) having no n-type region 1001. Assuming that the [n-type region depth/p-type base region] is represented by M, when the M was 0.5 or less, the maximum controllable current was increased compared with the conventional device in FIG. 1 by about 10%. When the M was 0.8 or more, the maximum controllable current was increased by about 20% or more. Especially, when the M was 1.1 close to 1, the maximum controllable current was increased by 26%.

FIG. 9 is a graph showing variations in maximum controllable current when a carrier life time is changed and when the M is set to be 1.1. When a carrier life time $\tau p$ was $5 \times 10^{-7}$ s or more (a turn-OFF fall time tf of about 1.0 μs), the maximum controllable current was not largely increased compared with a prior art. However, when the carrier life time $\tau p$ was $5 \times 10^{-7}$ s or less, the maximum controllable current was largely increased.

Figure 6:
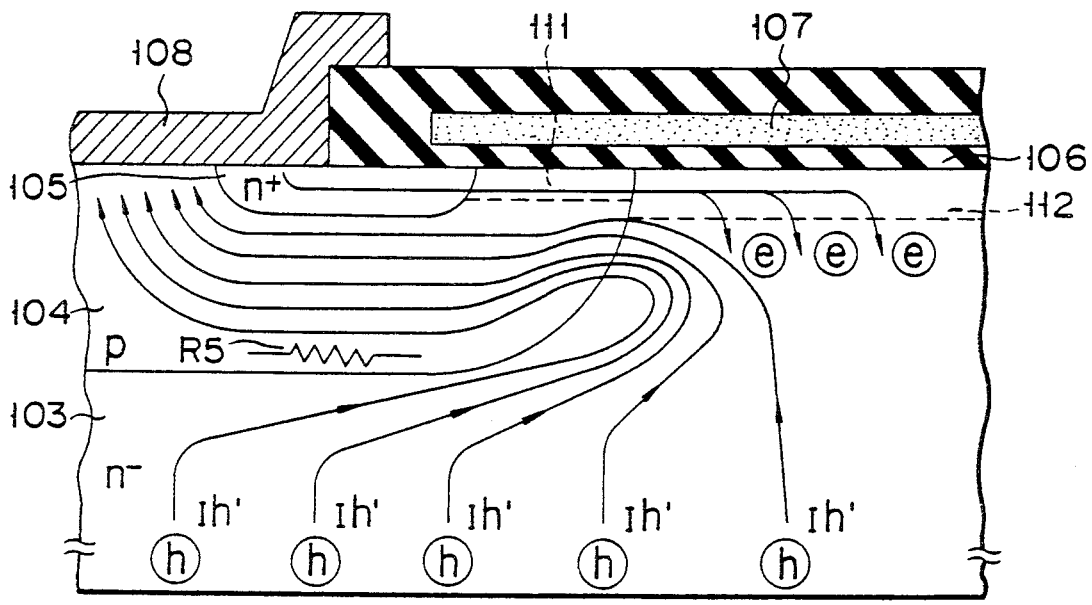

The function of the n-type region 1001 corresponding to an increase in maximum controllable current can be considered as follows. FIG. 10 is a sectional view showing the structure of an IGBT according to the above embodiment of the present invention and a flow of npn transistor. That is, in the arrangement of the present invention, since electrons "e" in the n-type region 1001 have a higher distribution density, when the carrier life time is sufficiently shortened, the distribution density of the electrons "e" is high under the p-type base region 104. Therefore, the localization of the hole current Ih' in the conventional case shown in FIG. 6 is moderated, thereby increasing a maximum controllable current.

This moderation of localization can be proved by evaluating a relationship between the depth of the n-type region 1001 and the maximum controllable current. When the depth of the n-type region 1001 is increased, the maximum current is increased accordingly. When the depth of the n-type region 1001 is almost equal to that of the p-type base region 104, the maximum controllable current can be optimized. Judging from these evaluation results, the n-type region 1001 contributes to this moderation.

When the n-type region 1001 is formed to have a larger depth, a further increase in maximum controllable current can be expected. When a sample in which [n-type region depth/p-type base region depth] M was set to be 1.3 was made, a forward breakdown voltage was largely reduced, and the maximum controllable current did not reach a value which should be evaluated.

Figure 11:
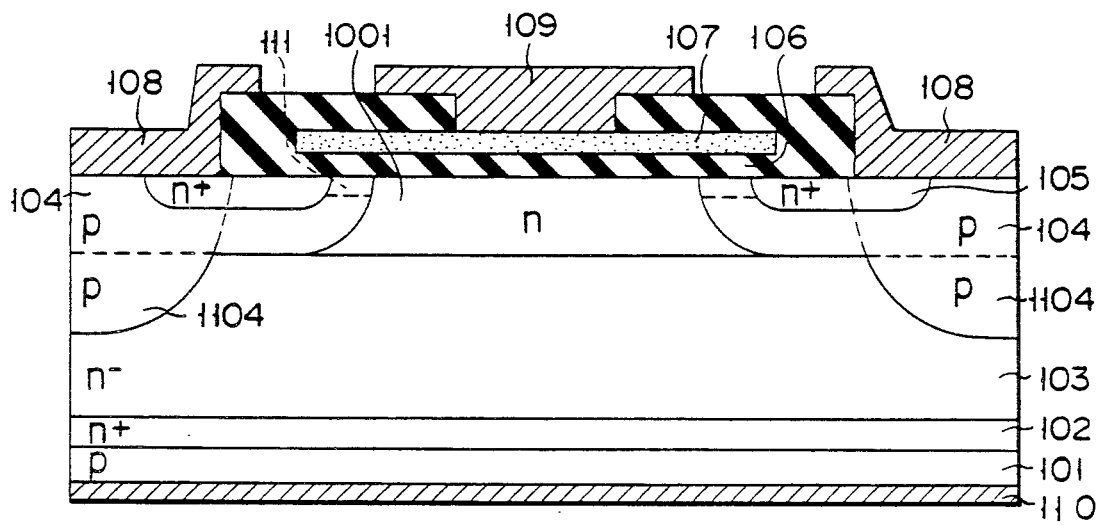
FIG. 11 is a sectional view showing a power semiconductor device (IGBT) according to the second embodiment of the present invention.

FIG. 11 is a sectional view showing an IGBT hole current when the carrier life time $\tau p$ is 50 ns. A difference between the flow of the hole current in the conventional case shown in FIG. 6 and the flow of the hole current shown in FIG. 10 occurs. As a result, the difference occurs in the localization of a hole current Ih' which induces the turn-ON operation of the parasitic according to the second embodiment. As a characteristic feature of the IGBT, a deep $p^+$-type base region (body region) 1104 integrated with a p-type base region 104 is formed. In this structure, as in the IGBT described in the first embodiment, a carrier life time can be sufficiently shortened to increase a maximum controllable current, as matter of course.

The present invention has been described on the basis of a basic unit cell sectional structure of an IGBT. In a practical IGBT, a large number of basic unit cells are repeatedly arranged. When an n-type region 1001 is formed, a sustaining voltage (avalanche breakdown voltage) is decreased. In order to solve this problem, a planar geometrical shape of the basic unit cell is important.

Figure 12:
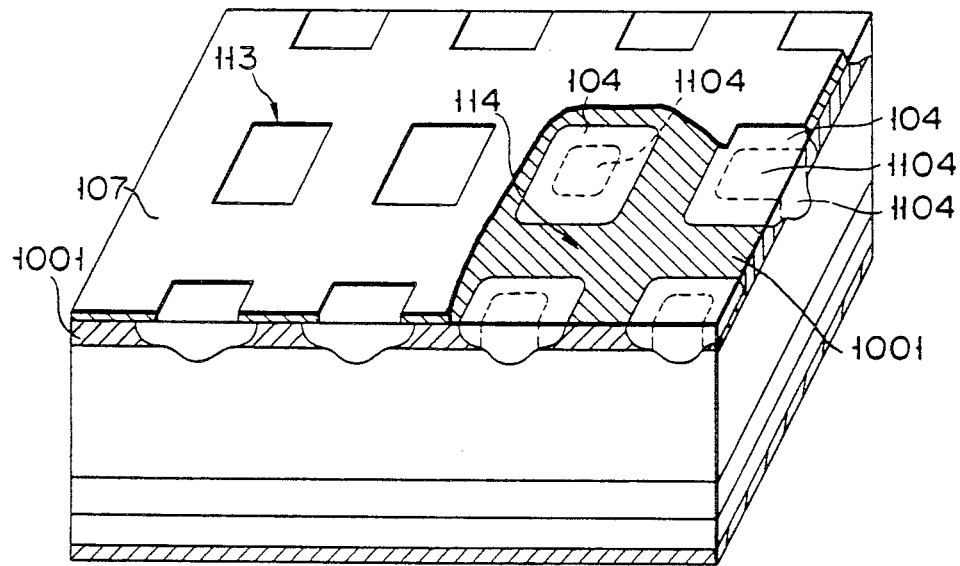

Parameters for determining a sustaining voltage are the strength of an electric field in a depletion region extending from a junction between a p-type base region 104 and an n⁻-type drain region 103 (including the n-type region 1001) to the n⁻-type drain region 103 (including the n-type region 1001), the corner concentration of the n⁻-type drain region 103, and the hole current density, and the sustaining voltage is determined by an avalanche breakdown given by these parameters. When a plurality of IGBTs are arranged, as in the MOSFET, as shown in FIG. 12, island-like p-type base regions 104 are respectively formed in a plurality of openings 113 formed in a polysilicon layer which is patterned in a mesh-like form. When the semiconductor devices described in the above embodiments are arranged as described above, an electric field is high at intersections 114 of the n-type region 1001 formed between adjacent semiconductor devices in a lattice form. As a result, an avalanche breakdown occurs to decrease the sustaining voltage.

In the application of the present invention shown in FIG. 13, a polysilicon layer 107 is formed in a mesh-like form as in FIG. 12. In addition, the p-type base region 104 (including a body region 1104) is formed in a ring-like form, and the n-type region 1001 is formed inside the p-type base region 104. Therefore, the n-type region 1001 is an island-like region surrounded by the p-type base region 104 (including the body region 1104).

In the applications in FIGS. 12 and 13, since the intersection (indicated by the reference numeral 114 in FIG. 12) of the lattice n-type region 1001 is not formed, an electric field is not locally concentrated. In addition, as shown in FIG. 13, when the p-type region 104 (including a body region 1104) is formed such that the island-like n-type region 1001 has a polygonal pattern constituted by obtuse angles or a polygonal pattern having curvature at corners, the local concentration of an electric field hardly occurs.

In these applications, the n-type region 1001 is an extended octagon. However, the n-type region 1001 may be a regular octagon or extremely extended. In the latter case, the n-type region 1001 has a so-called stripe-like polysilicon gate structure.

The effect of the unit cell shape for a maximum controllable current is well known, and it is known that the above stripe structure is optimal. In this sense, in order to maximally enhance the effect of the present invention, the semiconductor device of the present invention is desirably embodied combined with the above stripe-like polysilicon gate structure.

FIG. 14 shows a modification of the device shown in FIG. 7 wherein the device is combined with a stripe-like polysilicon gate structure.

Compared with the application in FIG. 13, in FIG. 14, a polysilicon bridge portion 1107 which crosses a stripe of the p-type base region 104 (including a body region 1104) is formed. In this structure, the pattern of the polysilicon gate has a so-called mesh-like shape. Nevertheless, as the shape of a unit cell, a stripe shape which effectively increases a maximum controllable current is maintained. Since the pattern of the polysilicon gate is close to a mesh-like shape, an internal resistance of the polysilicon gate is reduced compared with the stripe shape. A time constant of the gate circuit is reduced to obtain a power semiconductor device suitable for a high-frequency application.

The structures shown in FIGS. 13 and 14 provide a technique for effectively improving sustaining voltage characteristics and a technique for effectively improving high-speed switching characteristics, respectively.

FIG. 15 shows a modification of the embodiment shown in FIG. 11, and the n-type region 1001 is not formed in a region corresponding to the intersection 114 of the lattice-like n-type region 1001 shown in FIG. 11. That is, the n-type region 1001 having a high impurity concentration is not formed in the region having a high electric field strength. Therefore, when the low impurity concentration is kept, a decrease in avalanche breakdown value, i.e., a decrease in sustaining voltage can be prevented.

FIG. 16 shows a modification of the application shown in FIG. 13. An n-type stripe region 1001 is formed not to contact a p-type base region 104 and also a p⁺-type body region 1104 at an end of the n-type stripe region 1001 in the longitudinal direction. This has an effect for keeping a low impurity concentration at a relatively high electric field strength at the end of the n-type stripe region 1001 in the longitudinal direction.

Figure 17:
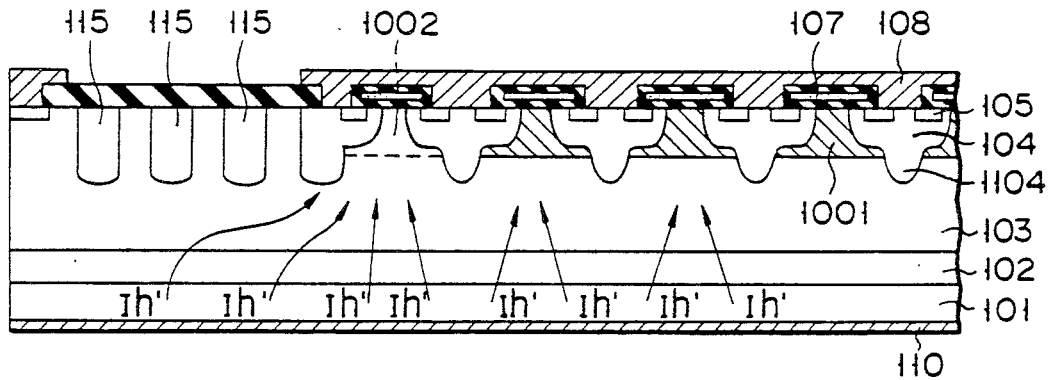
FIGS. 17 and 18 are sectional views showing modifications concerning a termination structure according to the above embodiments.

FIG. 17 shows a modification of a termination structure of the devices according to the embodiments of the present invention in FIGS. 7 to 11. In each of the embodiments of the present invention in FIGS. 7 to 11, the n-type region 1001 is formed in an entire active region. The n-type regions 1001 are formed on not only a portion indicated by diagonal lines descending in the lower right direction but a region 1002. However, in the modification in FIG. 17, the n-type region 1001 is not formed in the region 1002. That is, the n-type region 1001 is not formed in an outermost unit cell of the active region. In other words, the n-type region 1001 is not formed in a unit cell adjacent to a guard ring region 115 in which a unit cell is not arranged, i.e., to a nonactive region such as a region under a gate electrode metal wire. As shown in FIG. 17, hole current Ih' flowing into the outermost unit cell in a sustaining mode contains not only a hole current from the active region, but also a hole current from the nonactive region. For this reason, the hole current density of this unit cell is higher than that of general unit cells, and an avalanche breakdown voltage is lower than other unit cells. Therefore, since the n-type region 1001 is not formed, an n-type impurity concentration (doner concentration) can be kept to be low, thereby preventing the reduction of the avalanche breakdown.

However, in the device shown in FIG. 17, an effect for increasing a maximum controllable current of the outermost unit cell is slightly lost.

Figure 18:
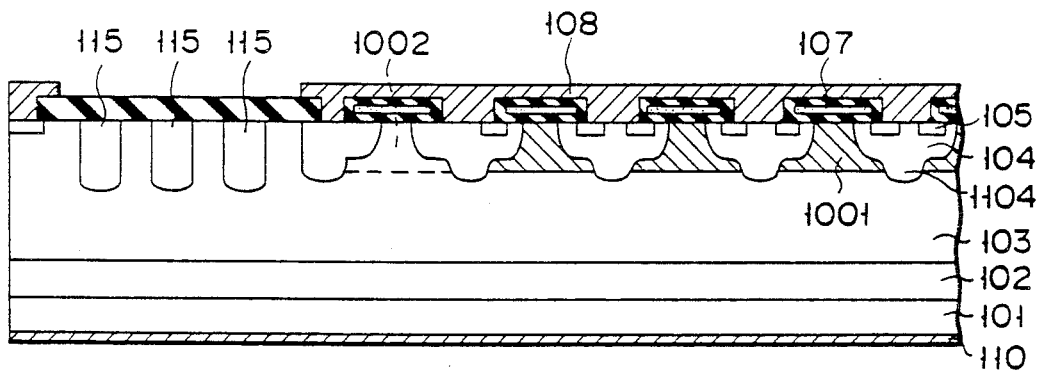

FIG. 18 shows a modification for improving the above problem. The n-type region 1001 is not formed in the outermost unit cell, i.e., in the region 1002, and the n⁺-type source region 105 is also not formed. For this reason, in the outermost unit cell, a parasitic npn transistor is not constituted. Although the n-type region 1001 is not formed in the region 1002, the unit does not limit the maximum controllable current.

Embodiments, applications, and modifications of the present invention have been described using n-channel IGBTs as examples. When the a conductivity type of each region is reversed, the present invention can be applied to a p-channel IGBT as in the n-channel IGBT.

As described above, according to the present invention, in a power semiconductor device (especially an IGBT), when high-speed turn-OFF characteristics ($tf < 0.3 \mu s$) can be obtained and a carrier life time can be sufficiently shortened ($\tau p < 1.5 \times 10^{17}$ s), a parasitic npn transistor is not easily turned on, and a sufficiently large controllable current can be obtained. Therefore, a power semiconductor device having good high-speed turn-OFF characteristics and a sufficiently wide safety operation area can be provided.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A power semiconductor device comprising:
   a first region comprising a semiconductor layer of a first conductivity type;
   a second region comprising at least one semiconductor layer of a second conductivity type on said first region;
   a third region comprising a semiconductor layer of the first conductivity type in said second region, said third region having an exposed surface;
   a fourth region comprising a semiconductor layer of the second conductivity type in said third region, said fourth region having an exposed surface;
   a fifth region comprising a semiconductor layer of the second conductivity type in said second region, said fifth region having an impurity concentration higher than that of said second region, and said fifth region having an exposed surface;
   an insulating layer on said exposed surfaces of said third, fourth and fifth regions; and
   a gate layer formed on said insulating layer;
   wherein said second region has a carrier life time shorter than $5 \times 10^{-7}$ s.

2. A device according to claim 1, wherein a plurality of said third regions are present, and each of said third regions is surrounded by said fifth region.

3. A device according to claim 1, wherein a plurality of said fifth regions are present, and each of said fifth regions is surrounded by said third region.

4. A device according to claim 1, wherein a depth of said fifth region falls within a range of 0.5 to 1.1 times a depth of said third region.

5. A device according to claim 1, wherein a planar geometric shape of said fifth region is of a polygon having obtuse angles.

6. A device according to claim 1, wherein a planar geometric shape of said fifth region is of a multilateral having a predetermined curvature at each corner.

7. A device according to claim 1, wherein said carrier lifetime is responsive to an electron beam.

8. A device according to claim 1, wherein said carrier lifetime is responsive to a neutron beam.

* * * * *